(12) United States Patent
Furuishi et al.

(10) Patent No.: US 10,637,639 B2
(45) Date of Patent: Apr. 28, 2020

(54) DATA SAMPLING DEVICE, AND DATA SAMPLING METHOD

(71) Applicant: OMRON Corporation, Kyoto (JP)

(72) Inventors: Norio Furuishi, Kusatsu (JP); Shuntaro Suzuki, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/161,106

(22) Filed: Oct. 16, 2018

(65) Prior Publication Data

US 2019/0238307 A1  Aug. 1, 2019

(30) Foreign Application Priority Data

Feb. 1, 2018 (JP) ................ 2018-016740

(51) Int. Cl.
*G06F 15/16* (2006.01)
*H04L 7/00* (2006.01)
*G05B 19/05* (2006.01)
*H03H 17/02* (2006.01)

(52) U.S. Cl.
CPC ............ *H04L 7/0091* (2013.01); *G05B 19/05* (2013.01); *G05B 19/054* (2013.01); *H03H 17/0223* (2013.01); *G05B 2219/1161* (2013.01); *G05B 2219/1176* (2013.01); *G05B 2219/15022* (2013.01); *G05B 2219/15057* (2013.01)

(58) Field of Classification Search
CPC ..... H04L 7/0091; G05B 19/05; G05B 19/054; G05B 2219/1161; G05B 2219/1176; G05B 2219/15022; G05B 2219/15057; H03H 17/0223

USPC ........................................................ 709/248
See application file for complete search history.

(56) References Cited

U.S. PATENT DOCUMENTS

| | | | | |
|---|---|---|---|---|
| 7,000,031 | B2* | 2/2006 | Fischer ................ | H04L 1/0003 709/248 |
| 7,079,977 | B2* | 7/2006 | Osorio ................ | A61B 5/0006 702/176 |
| 8,417,715 | B1* | 4/2013 | Bruckhaus ............ | G06Q 10/04 707/758 |
| 9,467,201 | B2* | 10/2016 | Asahina ............. | H04J 13/0077 |
| 10,215,619 | B1* | 2/2019 | Kovacs ................ | G01G 19/50 |
| 10,303,148 | B2* | 5/2019 | Aparicio Ojea .... | G05B 19/4183 |
| 10,326,831 | B2* | 6/2019 | Aoyama ................ | H04L 67/02 |
| 10,348,309 | B2* | 7/2019 | Nakajima ............. | H03L 7/095 |
| 10,389,514 | B2* | 8/2019 | Sinclair ............. | H04B 10/1125 |

(Continued)

FOREIGN PATENT DOCUMENTS

| EP | 3200035 | 8/2017 |
|---|---|---|
| JP | 2017134769 | 8/2017 |

OTHER PUBLICATIONS

"Search Report of Europe Counterpart Application", dated Mar. 26, 2019, p. 1-p. 9.

*Primary Examiner* — Melvin H Pollack
(74) *Attorney, Agent, or Firm* — JCIPRNET (57) ABSTRACT

To collect highly accurately filter-processed data. Sensor signals are acquired from sensors in predetermined data acquisition periods, a filtering process is performed on the sensor signals, time series data generated by extracting some of the filtered sensor signals is transmitted to an external device in a predetermined data transmission period that is longer than the data acquisition period, and the data transmission period is synchronized with a communication period of the external device.

9 Claims, 3 Drawing Sheets

(56) References Cited

U.S. PATENT DOCUMENTS

2017/0316061 A1* 11/2017 Hubauer ............... G05B 19/054
2018/0314225 A1* 11/2018 Bisse ..................... G05B 19/05
2019/0041845 A1*  2/2019 Cella ..................... H04L 1/0002

* cited by examiner

FIG. 1

| ADDRESS | | |
|---|---|---|
| dec | hex | |
| 0960 | 000 | TIME STAMP 0 |
| 0962 | 002 | TIME STAMP 1 |
| 0964 | 004 | TIME STAMP 2 |
| 0966 | 006 | TIME STAMP 3 |
| 0968 | 008 | CH1 STATUS |
| 0970 | 00A | RESERVATION |
| 0972 | 00C | RESERVATION |
| 0974 | 00E | RESERVATION |
| 0976 | 010 | RESERVATION |
| 0978 | 012 | NUMBER OF CH1 SAMPLING OPERATIONS(256) |
| | | (CH1 SAMPLED DATA) . . |
| 1492 | 214 | CH2 STATUS |
| 1494 | 216 | RESERVATION |
| 1496 | 218 | RESERVATION |
| 1498 | 21A | RESERVATION |
| 1500 | 21C | RESERVATION |
| 1502 | 21E | NUMBER OF CH2 SAMPLING OPERATIONS(80) |
| | | (CH2 SAMPLED DATA) . . |
| 1664 | 2C0 | CH3 STATUS |
| 1666 | 2C2 | RESERVATION |
| 1668 | 2C4 | RESERVATION |
| 1670 | 2C6 | RESERVATION |
| 1672 | 2C8 | RESERVATION |
| 1674 | 2CA | NUMBER OF CH3 SAMPLING OPERATIONS(512) |
| | | (CH3 SAMPLED DATA) . . |
| 2700 | 6CC | CH4 STATUS |
| 2702 | 6CE | RESERVATION |
| 2704 | 6D0 | RESERVATION |
| 2706 | 6D2 | RESERVATION |
| 2708 | 6D4 | RESERVATION |
| 2710 | 6D6 | NUMBER OF CH4 SAMPLING OPERATIONS(336) |
| | | (CH4 SAMPLED DATA) . |

DATA SAMPLING DEVICE, AND DATA SAMPLING METHOD

CROSS-REFERENCE TO RELATED APPLICATION

This application claims the priority benefit of Japanese application serial no. 2018-016740, filed on Feb. 1, 2018. The entirety of the above-mentioned patent application is hereby incorporated by reference herein and made a part of this specification.

BACKGROUND

Technical Field

The disclosure relates to a data sampling device and a data sampling method for sampling data such as sensor-detected signals and transmitting the sampled data to a control device.

Description of Related Art

There are general technologies of performing a filtering operation in a CPU unit for removing noise components of data collected from an input unit in the related art. However, because it took a lot of time to perform the filtering operation, the volume of data, accuracy of filtering, and the speed of filtering were dependent on the performance of the CPU. Thus, a technology of performing a filtering process on a large volume of collected data with high accuracy at a high speed, without being dependent on the performance of a CPU has been proposed (e.g., refer to Japanese Laid-open No. 2017-134769A).

A signal processing device disclosed in Japanese Laid-open No. 2017-134769A includes an input unit that collects signals in a period that is shorter than a transfer period in which data is transferred to a CPU unit, generates time series data, removes frequency noise from the time series data, and then transfers the time series data to the CPU unit.

In the above-described related art, for example, storing a large volume of collected data in a storage element such as a large capacity memory included in the input unit and transferring the data to a CPU unit over time may be conceived. In such a case, there is a problem that the volume of data to be collected depends on the capacity of the storage element of the input unit and thus the input unit may be expensive. In addition, there is concern of accuracy in filtering deteriorating if the amount of data is simply reduced. Thus, a data sampling device that can perform a filtering process on a large volume of collected data with high accuracy at a high speed independently of the capacity of a storage element of an input unit and the performance of a CPU unit is desired.

SUMMARY

An aspect of the disclosure realizes a technology that enables a filtering process to be performed with high accuracy at a high speed.

A data sampling device according to the disclosure is a data sampling device that performs a sampling process on sensor signals from sensors and transmits the sampled signals to an external device, and includes a data acquisition unit that acquires the sensor signals from the sensors in a predetermined data acquisition period, a filter processing unit that performs a filtering process on the sensor signals acquired by the data acquisition unit, a transmitter that transmits time series data generated by extracting some of the sensor signals filtered by the filter processing unit to the external device in a predetermined data transmission period that is longer than the data acquisition period, and a timing control unit that synchronizes the data transmission period with a communication period of the external device.

A data sampling method according to the disclosure is a data sampling method for performing a sampling process on sensor signals from sensors and transmitting the sampled signals to an external device, the method including a data acquisition step of acquiring the sensor signals from the sensors in a predetermined data acquisition period, a filter processing step of performing a filtering process on the acquired sensor signals, a transmission step of transmitting time series data generated by extracting some of the filtered sensor signals to the external device in a predetermined data transmission period that is longer than the data acquisition period, and a timing control step of synchronizing the data transmission period with a communication period of the external device.

DESCRIPTION OF THE EMBODIMENTS

An embodiment (which will be also referred to as "the present embodiment" below) according to an aspect of the disclosure will be described below with reference to the drawings. However, the present embodiment which will be described below is merely an example of the disclosure in all respects. It is a matter of course that the embodiment can be variously improved and modified without departing from the scope of the disclosure. That is, when the disclosure is implemented, a specific configuration may be appropriately adopted in accordance with an embodiment. Note that, although data appearing in the present embodiment is described using natural language, more specifically, it may be specified in computer-recognizable pseudo language, commands, parameters, machine language, or the like.

According to the above-described configuration, the time series data generated by extracting some of the filtered sensor signals is transmitted to the external device in a predetermined data transmission period that is longer than the data acquisition period. When frequency noise is removed through the filtering process, as a data acquisition frequency becomes higher, the range of the frequency of noise removable by a digital filter becomes wider. Thus, by shortening the data acquisition period by more than the data transmission period, the filtering process can be performed with higher accuracy. In addition, by extracting some of the filtered sensor signals and generating the time series data, a data transfer time can be shortened. Accordingly, the data sampling device can perform the filtering process with high accuracy and transmit sampled data obtained by extracting some of the filtered data to the external device at a high speed, without having a storage element such as a large capacity memory in an input unit. Thus, a data sampling device that can perform the filtering process with high accuracy at a high speed can be provided.

In addition, in this configuration, the data sampling device according to the disclosure further includes a data generation unit that extracts some of the sensor signals filtered by the filter processing unit and generates the time series data, and the data generation unit may extract some of the sensor signals from the sensor signals filtered by the filter processing unit by acquiring the sensor signals transferred from the filter processing unit in a predetermined data transfer period that is different from the data acquisition period.

According to the configuration, since some of the filtered sensor signals are extracted and the time series data is generated, a data transfer capacity can be reduced without decreasing the accuracy of the filtering process. Accordingly, the data sampling device can transmit the data filtered with high accuracy to the external device at a high speed. In addition, by setting the data acquisition period to be different from the data transfer period, only some of the sensor signals filtered with high accuracy can be extracted and data filtered with high accuracy can be transmitted to the external device at a high speed.

In addition, in the configuration of the data sampling device according to the disclosure, the data generation unit may combine the sensor signals transferred in the data transfer period for a plurality of transfer periods and generate the time series data.

According to the configuration, since the data for the plurality of transfer periods can be combined and transmitted to the external device so as to be synchronized with the communication period of the external device, data efficiently filtered with high accuracy can be transmitted to the external device at a high speed.

In addition, in the configuration of the data sampling device according to the disclosure, the timing control unit may synchronize the data transmission period with the communication period of the external device by controlling the data transmission period.

According to the configuration, a data efficiently filtered with high accuracy can be transmitted to the external device at a high speed in synchronization with the communication period of the external device.

In addition, in the configuration of the data sampling device according to the disclosure, the filter processing unit may remove frequency noise from the sensor signals.

According to the configuration, the range of the frequency of the noise removable by shortening the data acquisition period can be widened, and data filtered with high accuracy can be transmitted to the external device.

In addition, in the configuration, the data sampling device according to the disclosure may include a plurality of data processing channels each having the data acquisition unit and the filter processing unit, and the data generation unit may generate the time series data by acquiring the sensor signals processed through each of the data processing channels.

According to the configuration, the filtering process can be performed with high accuracy in parallel on the plurality of channels, and sampled data obtained by extracting part of filtered data can be transmitted to the external device at a high speed.

According to the method, the filtering process can be performed with high accuracy without a storage element such as a large-capacity memory, and sampled data obtained by extracting part of filtered data can be transmitted to the external device at a high speed. Thus, the filtering process can be performed with high accuracy at a high speed.

According to an aspect of the disclosure, data filtered with high accuracy can be collected.

§ 1 Application Example

Figure 1:
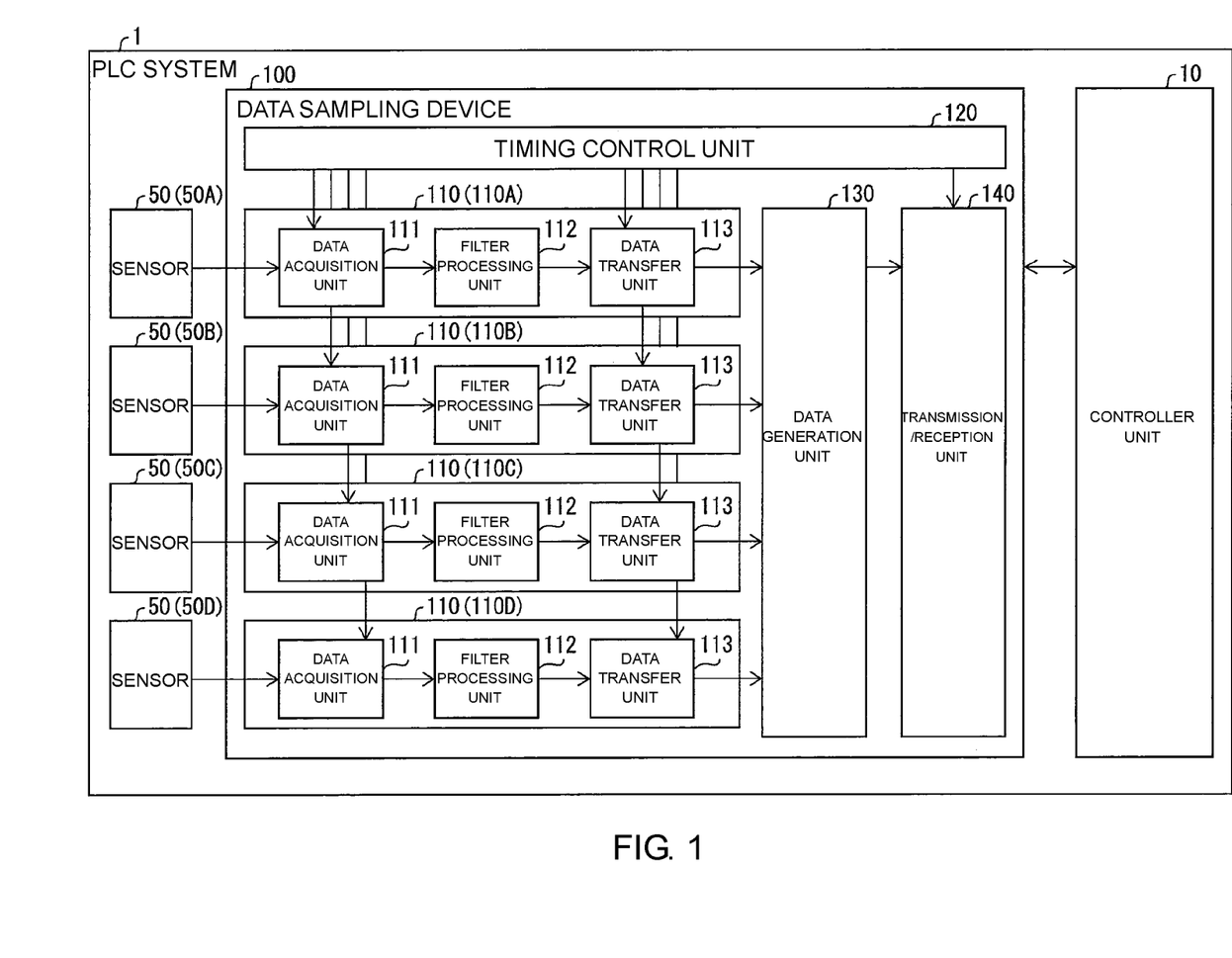
FIG. 1 is a block diagram illustrating a schematic configuration of a data sampling device according to an embodiment.

First, an example of a case to which the disclosure is applied will be described using FIG. 1. FIG. 1 illustrates an example of a schematic configuration of a data sampling device 100 according to the present embodiment. The data sampling device 100 according to the present embodiment is used as, for example, a functional unit of a programmable logic controller (PLC) system 1 as illustrated in FIG. 1. The PLC system 1 is a system that controls an output apparatus, which is a control target of a machine, a facility, and the like using signals from an input apparatus. The input apparatus includes, for example, a "detector" such as a temperature sensor or a light sensor, a "switch (a pushbutton switch, a limit switch, a pressure switch, etc.)," and the like. The output apparatus includes, for example, a "motor," a "robot arm," an "actuator," a "relay," a "solenoid valve," a "display," an "indicating lamp," and the like.

The PLC system 1 includes the data sampling device 100 that performs a sampling process on signals from sensors 50 serving as an input apparatus and a controller unit 10 that executes an arithmetic process using data sampled by the data sampling device 100 and generates output data for controlling a control target.

The data sampling device 100 serves as, for example, an input unit of an FA apparatus, performs a filtering process on sensor signals acquired from the sensors 50 at a high speed using a field-programmable gate array (FPGA), or the like and transmits the filtered signals to the controller unit 10. Accordingly, the data sampling device 100 reduces an amount of communication with the controller unit 10 as well as a calculation load of the controller unit 10.

Note that the data sampling device 100 is not limited to a configuration of being used as a functional unit of a PLC system, and may be a device that acquires sensor signals from the sensors 50 serving as an input apparatus, performs a filtering process, and transmits data to an external device for controlling a control target such as an industrial PC (IPC), or the like.

As illustrated in FIG. 1, the data sampling device 100 includes data processing channels 110 on which sensor signals acquired from the sensors 50 are processed. The data sampling device 100 includes the plurality of data processing channels 110 in accordance with the number of sensors 50 that acquire sensor signals.

In addition, the data sampling device 100 includes a timing control unit 120 that controls timings at which the data processing channels 110 acquire sensor signals from the sensors 50 and timings at which filtered sensor signals are transferred. In addition, the data sampling device 100 includes a data generation unit 130 that generates time series data by acquiring sensor signals transferred from each of the plurality of data processing channels 110. In addition, the data sampling device 100 includes a transmission/reception unit (a transmitter) 140 that transmits the time series data generated by the data generation unit 130 to the controller unit 10 in accordance with control of the timing control unit 120. The transmission/reception unit 140 functions as a transmitter that transmits data to the controller unit 10 and a receiver that receives data, for example, control information or the like from the controller unit 10.

Each of the data processing channels 110 thins out some of filtered sensor signals and transfers the sensor signals to the data generation unit 130. Accordingly, the data generation unit 130 extracts some of the filtered sensor signals and generates time series data. In addition, the data generation unit 130 combines sensor signals for a plurality of transfer periods and generates time series data. In this manner, the data sampling device 100 performs the filtering process on the sensor signals acquired from the plurality of sensors 50, thins out some of the sensor signals, combines the sensor signals for a plurality of periods, and then transmits the sensor signals to the controller unit 10. Note that the filtering process, the extraction process, and the time series data generation process performed by the data sampling device 100 are collectively referred to as a sampling process in the present embodiment.

Accordingly, in the present embodiment, sampling periods of the data sampling device 100 and periods of the controller unit 10 can be made independent from each other, and data acquired from the sensors 50 can be set to undergo a highly accurate filtering process and then transmitted to the controller unit 10. Thus, the data sampling device 100 can transmit sampled data, which is obtained by performing the filtering process with high accuracy and extracting some of the filtered data, to an external device at a high speed without a storage element such as a large capacity memory or the like even if there is a large amount of data to be collected.

§ 2 Configuration Example

A configuration of the data sampling device 100 according to an embodiment of the disclosure will be described in detail below with reference to FIG. 1 to FIG. 3.

FIG. 1 is a block diagram illustrating a schematic configuration of the PLC system 1 including the data sampling device 100. As illustrated in FIG. 1, the PLC system 1 includes the plurality of sensors 50 (50A to 50D), the data sampling device 100, and the controller unit 10. Note that, although not illustrated, the data sampling device 100 may be connected to an external device such as an external controller via a communication network.

The controller unit 10 mainly executes arithmetic processes in the PLC system 1. The controller unit 10 controls a control target by repeating processes of transmission of output data, reception of input data, execution of a control program to generate output data by using input data, and the like.

The sensors 50 detect state values (e.g., physical amounts such as weights or pressures) of a control target, which is not illustrated, and output sensor signals corresponding to the detected state values. The sensors 50 are, for example, load cells installed in a control target (e.g., an industrial machine such as a weighing device). The control target is, for example, a platform balancing system, a quantitative cutout control system, a pressure fitting system, or the like.

Regarding Configuration of Data Sampling Device 100

The data sampling device 100 includes the data processing channels 110, the timing control unit 120, the data generation unit 130, and the transmission/reception unit 140. The data sampling device 100 is a signal processing device that processes sensor signals from the sensors 50 and transmits the sensor signals to the controller unit 10.

The data processing channels 110 are functional blocks that process sensor signals from the sensors 50 and each of the data processing channels includes a data acquisition unit 111, a filter processing unit 112, and a data transfer unit 113.

The data acquisition unit 111 acquires sensor signals from the sensor 50 in predetermined data acquisition periods. The data acquisition unit 111 may have a function of amplifying the sensor signals from the sensor 50. In addition, the data acquisition unit 111 may be an A/D converter that converts sensor signals from the sensor 50 into digital signals when the sensor signals are analog signals.

The filter processing unit 112 performs a filtering process on the sensor signals acquired by the data acquisition unit 111. The filter processing unit 112 includes, for example, a digital filter, and removes frequency noise from the sensor signal. The type and number of filters included in the filter processing unit 112 are not particularly limited. The type of filters included in the filter processing unit 112 may be, for example, a low-pass filter, a moving average filter, a notch filter, or the like.

The data transfer unit 113 transfers some of the sensor signals, which have been acquired by the data acquisition unit 111 and undergone the filtering process by the filter processing unit 112, to the data generation unit 130 in a time series manner. A data transfer period in which the data transfer unit 113 transfers a sensor signal to the data generation unit 130 is longer than a data acquisition period in which the data acquisition unit 111 acquires the sensor signal from the sensors 50. The data transfer unit 113 transfers only some of the sensor signals, which have been acquired by the data acquisition unit 111 in predetermined data acquisition periods and undergone the filtering process by the filter processing unit 112, the data acquisition periods being synchronized with data transfer periods, to the data generation unit 130.

As described above, the data processing channels 110 thin out the sensor signals that have undergone the filtering process by the filter processing unit 112 and then transfer some of the sensor signals to the data generation unit 130 in a time series manner. Accordingly, noise can be removed from the sensor signals acquired in the data acquisition periods that are shorter than the data transfer periods with high accuracy.

In the configuration in which the filter processing unit 112 has the digital filter and removes frequency noise of the sensor signals as described above, a frequency from which noise can be removed depends on a data acquisition frequency of the data acquisition unit 111. That is, as the data acquisition frequency becomes higher, the range of the frequency of noise removable by the digital filter becomes wider. The present embodiment describes a configuration in which a data acquisition frequency of the data acquisition unit 111 is set to be high, and acquired sensor signals undergo the filtering process, then are thinned out, and are transferred to the data generation unit 130. Accordingly, the data sampling device 100 can remove noise of a high frequency with high accuracy and can transfer the data to the controller unit 10 at a high speed.

Since the filter processing unit 112 can remove noise in a wide frequency range as described above, the accuracy of the filtering process can be improved. In addition, since the data processing channels 110 transfers some of the sensor signals acquired by thinning out the filtered sensor signals to the data generation unit 130, a data communication amount can be reduced. Thus, the data sampling device 100 can transfer the data filtered with high accuracy at a high speed to the controller unit 10.

In addition, the data sampling device 100 may include a plurality of data processing channels 110 each having the data acquisition unit 111, the filter processing unit 112, and the data transfer unit 113. FIG. 1 illustrates the data sampling device 100 including the four data processing channels 110A to 110D, each of the data processing channels 110A to 110D having the data acquisition unit 111, the filter processing unit 112, and the data transfer unit 113. Each of the data processing channels 110A to 110D processes sensor signals acquired from the sensors 50A to 50D. Note that the number of data processing channels 110 included in the data sampling device 100 is not limited to four.

The data generation unit 130 acquires the sensor signals transferred from the data transfer unit 113 in predetermined data transfer periods and generates time series data. In this way, the data generation unit 130 acquires the sensor signals filtered by the filter processing unit 112 and then transferred from the filter processing unit 112 via the data transfer unit 113 in the predetermined data transfer periods, which are different from the data acquisition periods of the data acquisition unit 111, and then extracts some sensor signals therefrom. That is, the data generation unit 130 acquires the sensor signals thinned out by the data transfer unit 113 and thereby extracts some of the sensor signals filtered by the filter processing unit 112.

The data generation unit 130 generates time series data by combining the sensor signals transferred from the data transfer unit 113 in the predetermined data transfer periods. By combining the sensor signals for a plurality of transfer periods and generating the time series data, the data communication amount can be reduced, which enables high-speed data sampling.

In addition, by acquiring the sensor signals filtered through each of the plurality of data processing channels 110A to 110D, some of which have been thinned out, the data generation unit 130 generates the time series data corresponding to the sensor signals from each of the data processing channels 110A to 110D.

Figure 2:
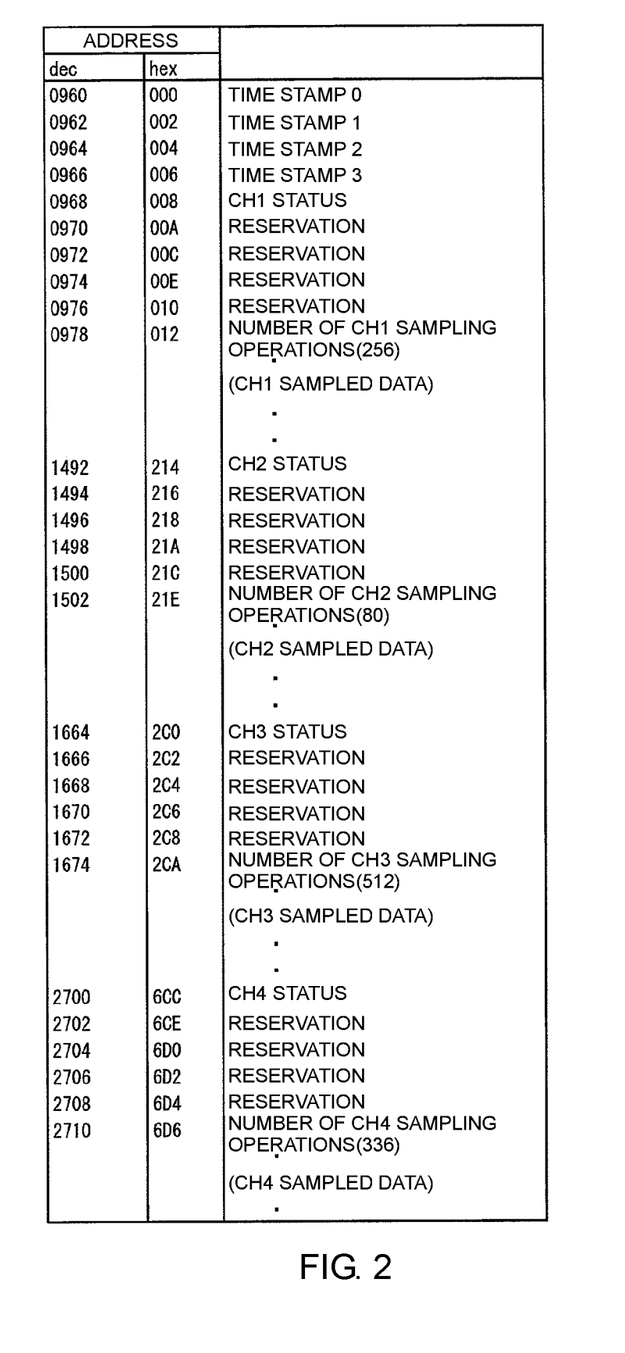
FIG. 2 is a diagram illustrating an example of time series data generated by a data generation unit.

FIG. 2 is a diagram illustrating an address map of a memory of the data generation unit 130. As illustrated in FIG. 2, the data generation unit 130 stores data corresponding to the sensor signals from each of the data processing channels 110A to 110D in accordance with the number of pieces of data set in advance in a time series manner. The data generation unit 130 updates the map in each data transmission/reception period. The data generation unit 130 calculates a start address and updates the map in each data transmission/reception period. In addition, the data generation unit 130 sets the number of data sampling operations for each of the data processing channels 110A to 110D and stores data corresponding to the set number of data sampling operations in each data transmission/reception period.

In FIG. 2, various types of data described below are stored in addresses denoted by decimal notation (dec) and hexadecimal notation (hex). The data generation unit 130 stores time stamps, each of which indicates a start time of a data transmission/reception period with respect to the controller unit 10, at a predetermined address in each data transmission/reception period. In the example illustrated in FIG. 2, time stamps 0 to 3 indicate the start times of the data transmission/reception periods. The start time of the data transmission/reception period is, for example, the time of 10 μs in the example illustrated in FIG. 3 which will be described below, and information indicating the start time is stored as the time stamps 0 to 3.

In addition, the data generation unit 130 may secure addresses at which information indicating the status of each of the data processing channels 110A to 110D is recorded in each data transmission/reception period. In the status of the channel (CH status), information indicating whether the state of the channel is a normal state or an error state is written.

In addition, the data generation unit 130 may secure addresses that can be used for an application other than values of sampled data for each of the data processing channels 110A to 110D. An address that can be used for another application is indicated by "reservation" in the example illustrated in FIG. 2.

In addition, the data generation unit 130 allocates the number of sampling operations that is information indicating the number of pieces of data to be sampled in one data transmission/reception period on each channel to a predetermined address for data of each of the data processing channels 110A to 110D. In the example illustrated in FIG. 2, the number of sampling operations is indicated by the "number of Ch1 sampling operations (256)" or the like.

The data generation unit 130 stores sampled data of the predetermined number of sampling operations at each of addresses following the address indicating the number of sampling operations on one data processing channel (the addresses between the addresses 0978 to 1492 between Ch1 and Ch2).

When one data transmission/reception period ends (at 70 μs in the example illustrated in FIG. 3 which will be described below), the data generation unit 130 clears the memory and appropriately stores various types of data of the next data transmission/reception period at each address.

The transmission/reception unit 140 transmits the time series data generated by the data generation unit 130 to the controller unit 10 in a predetermined data transmission period that is longer than a data acquisition period of the data acquisition unit 111. The transmission/reception unit 140 transmits the time series data generated by the data generation unit 130 to the controller unit 10 in the data transmission period synchronized with a communication period of the controller unit 10.

The PLC system 1 executes a series of processes including a common process, a program execution process, an I/O refresh process, a peripheral service process, and the like in a predetermined period. The controller unit 10 executes communication with various functional units to be controlled in each period (communication period) of the PLC system 1.

The timing control unit 120 controls the data acquisition periods of the data acquisition unit 111, the data transfer periods of the data transfer unit 113, and the data transmission periods of the transmission/reception unit 140. The timing control unit 120 has, for example, a time synchronization function based on a distributed clock (DC) scheme. The data sampling device 100 and the controller unit 10 each have timers that periodically generate time information (reference clocks) serving as the reference of synchronization as each clock. The timing control unit 120 can correct a time deviation occurring in the timers and synchronize the data transmission periods of the transmission/reception unit 140 with the communication periods of the controller unit 10.

Regarding Control by Timing Control Unit 120

Figure 3:
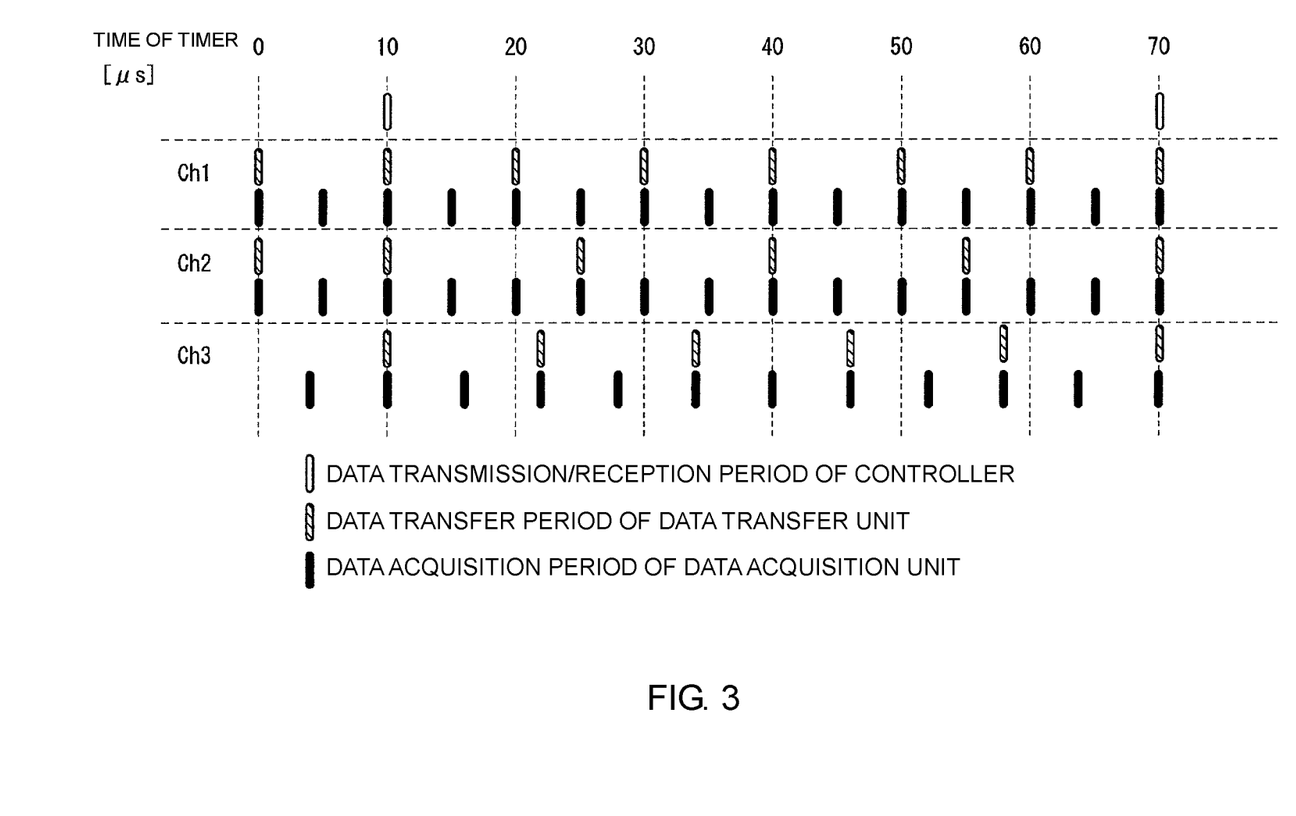
FIG. 3 is a diagram illustrating an example of control over periods of data acquisition, data transfer, and data transmission by a timing control unit.

FIG. 3 is a diagram illustrating an example of synchronization control by the timing control unit 120. In FIG. 3, an example in which sensor signals are acquired from the sensors 50 via three data processing channels Ch1 to Ch3 and time series data is transmitted to the controller unit 10 is illustrated. In addition, in FIG. 3, the data transmission periods of the transmission/reception unit 140 are indicated by outlined lines, the data transfer periods of the data transfer unit 113 of each of the channels Ch1 to Ch3 are indicated by shaded lines, and the data acquisition periods of the data acquisition unit 111 of each of the channels Ch1 to Ch3 are indicated by black lines.

The timing control unit 120 controls each of the data acquisition periods in which the data acquisition unit 111 of each of the data processing channels Ch1 to Ch3 acquires the sensor signals from the sensors 50. Accordingly, the data acquisition unit 111 of each of the channels Ch1 to Ch3 can acquire the sensor signals from the sensors 50 in each of different data acquisition periods. The timing control unit 120 controls the data acquisition periods such that the data acquisition unit 111 acquires the sensor signals from the sensors 50 at, for example, a data acquisition period of 5 μs to 10 μs.

In addition, the timing control unit 120 controls each of the data transfer periods in which the data transfer unit 113 on each of the channels Ch1 to Ch3 transfers the sensor signals filtered by the filter processing unit 112 to the data generation unit 130. Accordingly, the data transfer unit 113 of each of the channels Ch1 to Ch3 can transfer the filtered sensor signals in each of different data transfer periods.

The timing control unit 120 controls the data transfer periods such that the data transfer periods are longer than the data acquisition periods and the data transfer periods are synchronized with the data acquisition periods for each of the predetermined number of data transfer periods. For example, the timing control unit 120 sets the data transfer periods of the data transfer unit 113 to become two times longer than the data acquisition periods of the data acquisition unit 111 on the channel Ch1. Accordingly, the filtered sensor signals are thinned out at every other signals and one half of the number of the filtered sensor signals are extracted by the data generation unit 130.

In addition, the timing control unit 120 sets the data transfer periods of the data transfer unit 113 to become three times longer than the data acquisition periods of the data acquisition unit 111 of the channel Ch2. Accordingly, two thirds of the filtered sensor signals are thinned out and every third sensor signals thereof are extracted by the data generation unit 130.

In addition, the timing control unit 120 sets the data acquisition periods of the data acquisition unit 111 of the channel Ch3 to have a different length from the data acquisition periods of the data acquisition unit 111 of the channel Ch1. In addition, the timing control unit 120 sets the data transfer periods of the data transfer unit 113 of the channel Ch3 to become two times longer than the data acquisition periods of the data acquisition unit 111 of the channel Ch3. Accordingly, the filtered sensor signals are thinned out at every other signal and thus one half of the filtered sensor signals are transferred to the data generation unit 130 in a period different from the data transfer periods of the channel Ch1.

The timing control unit 120 controls each data acquisition period and data transfer period of each channel and controls each data transfer period as described above, and thereby synchronizes the data transmission period in which the transmission/reception unit 140 transmits the time series data generated by the data generation unit 130 to the controller unit 10 with the communication period of the controller unit 10.

In the present embodiment, for example, sensor signals processed through the channel Ch1 are combined for six transfer periods, and thereby time series data is generated and transferred to the controller unit 10. The timing control unit 120 sets the length of the transfer period in which the sensor signals are transferred from the channel Ch1 to the data generation unit 130 to be one sixths of the length of the communication period of the controller unit 10, and thereby synchronizes the transfer period in which the sensor signals are transferred from the channel Ch1 to the data generation unit 130 with the communication period of the controller unit 10.

In addition, sensor signals processed through the channel Ch2 are combined for four transfer periods, and thereby time series data is generated and transmitted to the controller unit 10. The timing control unit 120 sets the length of the transfer period in which the sensor signals are transferred from the channel Ch2 to the data generation unit 130 to be one fourths of the communication period of the controller unit 10, and thereby synchronizes the transfer period in which the sensor signals are transferred from channel Ch2 to the data generation unit 130 with the communication period of the controller unit 10.

In addition, sensor signals processed through the channel Ch3 are combined for five transfer periods, and thereby time series data is generated and transmitted to the controller unit 10. The timing control unit 120 sets the length of the transfer period in which the sensor signals are transferred from the channel Ch3 to the data generation unit 130 to be one fifths of the communication period of the controller unit 10, and thereby synchronizes the transfer period in which the sensor signals are transferred from channel Ch3 to the data generation unit 130 with the communication period of the controller unit 10.

As described above, the timing control unit 120 controls the data acquisition periods of the data acquisition units 111, the data transfer periods of the data transfer unit 113, and the data transmission periods of the transmission/reception unit 140. Accordingly, the data sampling device 100 performs the filtering process on the sensor signals acquired by the data acquisition units 111 and thins out some of the filtered sensor signals. Then, the data sampling device 100 extracts some of the filtered sensor signals and transfers them to the data generation unit 130. The data generation unit 130 combines the filtered sensor signals for a plurality of transfer periods, then generates time series data, and transmits the data to the controller unit 10.

Thus, even if there are many sensor signals from the sensors 50, data filtered with high accuracy can be collected without taking time for data transfer, and thus high-speed and highly accurate data sampling is possible.

Implementation Example by Software

The control blocks of the data sampling device 100 (particularly, the data acquisition unit 111, the filter processing unit 112, the data transfer unit 113, the timing control unit 120, the data generation unit 130, and the transmission/reception unit 140) may be implemented by logic circuits (hardware) formed by integrated circuits (IC chips) and the like or by software.

In the latter case, the data sampling device 100 includes a computer that executes commands of a program that is software for implementing each function. The computer includes, for example, one or more processors and a computer readable recording medium storing the program. In addition, when the processors read the program from the recording medium for execution in the computer, the effects of the disclosure are achieved. Central processing units (CPUs), for example, can be used as the processors. A "non-transitory tangible medium," for example, a tape, a disc, a card, a semiconductor memory, a programmable logic circuit, or the like as well as a read only memory (ROM) can be used as the recording medium. In addition, a random access memory (RAM) for expanding the program may be further included. In addition, the program may be supplied to the computer via an arbitrary transmission medium capable of transmitting the program (a communication network, broadcast waves, etc.). Note that an aspect of the disclosure can also be realized in a form of a data signal embedded in a carrier wave realized through electronic transmission of the program.

The disclosure is not limited to each above-described embodiment and can be variously modified within the scope specified in the claims, and an embodiment obtained by appropriately combining technical means disclosed in different embodiments is also included in the technical scope of the disclosure.

What is claimed is:

1. A data sampling device that performs a sampling process on sensor signals from sensors and transmits the sampled signals to an external device, the data sampling device comprising:
   a converter that acquires the sensor signals from the sensors in a predetermined data acquisition period;
   a filter that performs a filtering process on the sensor signals acquired by the converter;
   a transmitter that transmits time series data generated by extracting some of the sensor signals filtered by the filter to the external device in a predetermined data transmission period that is longer than the data acquisition period;
   a timing controller that synchronizes the data transmission period with a communication period of the external device; and
   a data generator that extracts some of the sensor signals filtered by the filter and generates the time series data,
   wherein the data generator extracts some of the sensor signals from the sensor signals filtered by the filter by acquiring the sensor signals transferred from the filter in a predetermined data transfer period that is different from the data acquisition period,
   wherein the data generator combines the sensor signals transferred in the data transfer period for a plurality of transfer periods and generates the time series data.

2. The data sampling device according to claim 1, wherein the timing controller synchronizes the data transmission period with the communication period of the external device by controlling the data transmission period.

3. The data sampling device according to claim 1, wherein the filter processing unit removes frequency noise from the sensor signals.

4. The data sampling device according to claim 1, further comprising:
   a plurality of data processing channels each having the converter and the filter,
   wherein the data generator generates the time series data by acquiring the sensor signals processed through each of the data processing channels.

5. The data sampling device according to claim 2, wherein the filter removes frequency noise from the sensor signals.

6. The data sampling device according to claim 2, further comprising:
   a plurality of data processing channels each having the converter and the filter,
   wherein the data generator generates the time series data by acquiring the sensor signals processed through each of the data processing channels.

7. The data sampling device according to claim 3, further comprising:
   a plurality of data processing channels each having the converter and the filter,
   wherein the data generator generates the time series data by acquiring the sensor signals processed through each of the data processing channels.

8. A data sampling method for performing a sampling process on sensor signals from sensors and transmitting the sampled signals to an external device, the method comprising:
   acquiring the sensor signals from the sensors in a predetermined data acquisition period;
   performing a filtering process on the acquired sensor signals;
   transmitting time series data generated by extracting some of the filtered sensor signals to the external device in a predetermined data transmission period that is longer than the data acquisition period;
   synchronizing the data transmission period with a communication period of the external device;
   extracting some of the sensor signals from the sensor signals filtered by the filter process by acquiring the sensor signals transferred from the filter process in a predetermined data transfer period that is different from the data acquisition period; and
   combining the sensor signals transferred in the data transfer period for a plurality of transfer periods and generating the time series data.

9. A data sampling device that performs a sampling process on sensor signals from sensors and transmits the sampled signals to an external device, the data sampling device comprising:
   a processor configured to:
   acquire the sensor signals from the sensors in a predetermined data acquisition period;
   perform a filtering process on the acquired sensor signals;
   transmit time series data generated by extracting some of the filtered sensor signals to the external device in a predetermined data transmission period that is longer than the data acquisition period;
   synchronize the data transmission period with a communication period of the external device;
   extract some of the sensor signals from the sensor signals filtered by the filter process by acquiring the sensor signals transferred from the filter process in a predetermined data transfer period that is different from the data acquisition period; and
   combine the sensor signals transferred in the data transfer period for a plurality of transfer periods and generate the time series data.

* * * * *